(12) United States Patent
Shen et al.

(10) Patent No.: US 6,548,337 B2
(45) Date of Patent: Apr. 15, 2003

(54) METHOD OF MANUFACTURING A HIGH GAIN BIPOLAR JUNCTION TRANSISTOR WITH COUNTERDOPED BASE IN CMOS TECHNOLOGY

(75) Inventors: Chi-Cheong Shen, Richardson, TX (US); David B. Spratt, Plano, TX (US); Michael D. Aragon, Sachse, TX (US); Kamel Benaissa, Richardson, TX (US)

(73) Assignee: Instruments Incorporated, Dallas, TX (US)

( * ) Notice: Subject to any disclaimer, the term of this patent is extended or adjusted under 35 U.S.C. 154(b) by 0 days.

(21) Appl. No.: 09/977,025

(22) Filed: Oct. 12, 2001

(65) Prior Publication Data

US 2002/0058373 A1 May 16, 2002

Related U.S. Application Data

(60) Provisional application No. 60/244,543, filed on Oct. 31, 2000.

(51) Int. Cl.$^7$ .......................................... H01L 21/8238
(52) U.S. Cl. ...................... 438/202; 438/234; 438/350
(58) Field of Search ............................... 438/309, 324, 438/202, 234, 350, 203, 204, 205

(56) References Cited

U.S. PATENT DOCUMENTS 6,001,701 A  * 12/1999  Carroll et al. ....... 148/DIG. 10
6,117,718 A  *  9/2000  Hwang et al. .............. 257/370
6,127,213 A  * 10/2000  Tung .......................... 257/370

* cited by examiner

*Primary Examiner*—Tuan H. Nguyen
(74) *Attorney, Agent, or Firm*—Peter K. McLarty; W. James Brady III; Frederick J. Telecky, Jr.

(57) ABSTRACT

A method is described for forming a high gain bipolar junction transistor in a optimized CMOS integrated circuit. The bipolar junction transistor comprises a compensated base region (130) which is formed by forming the p-well region (20) and the n-well region (30) in a common substrate region.

14 Claims, 6 Drawing Sheets

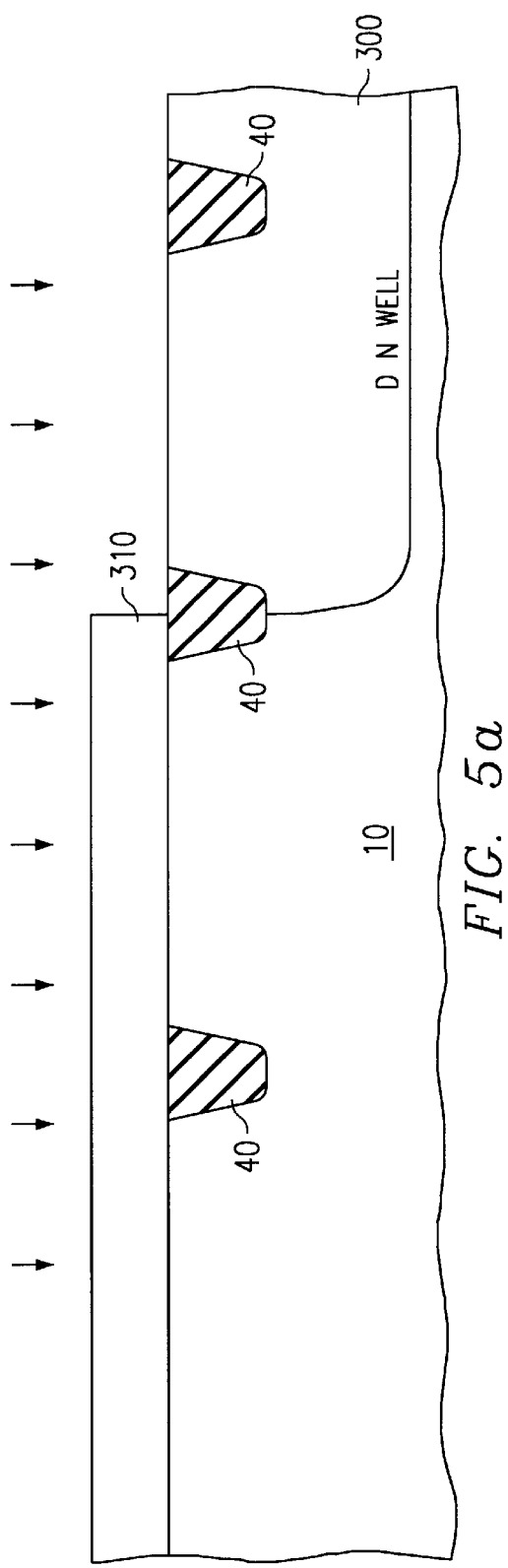
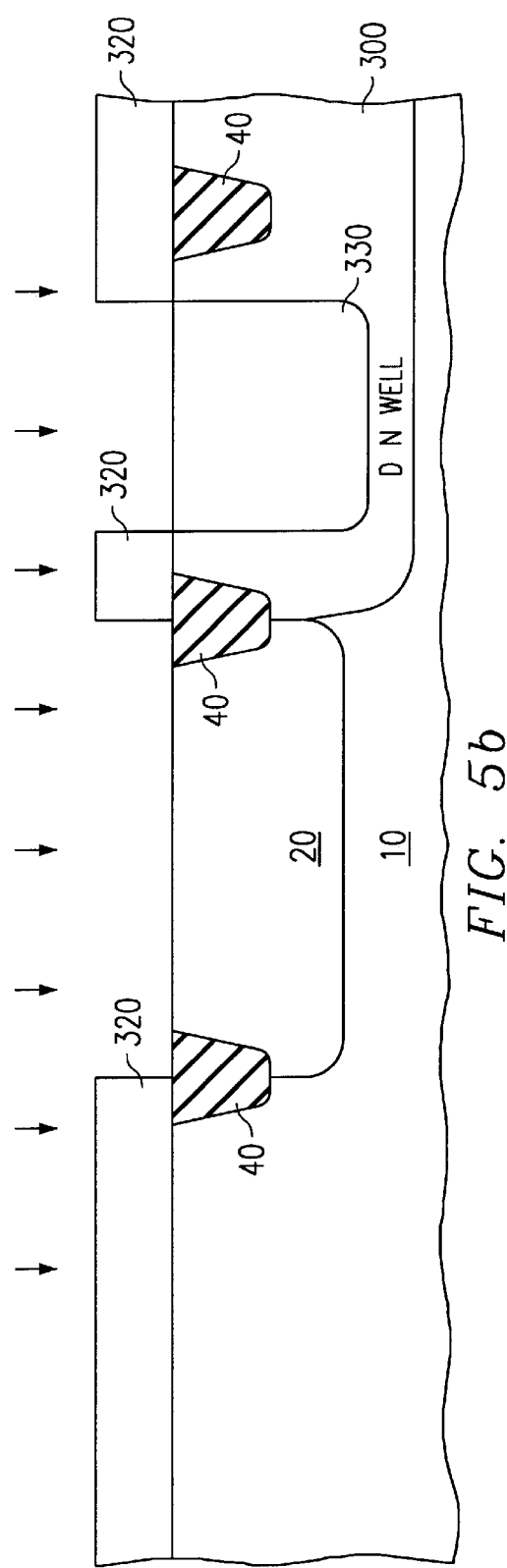

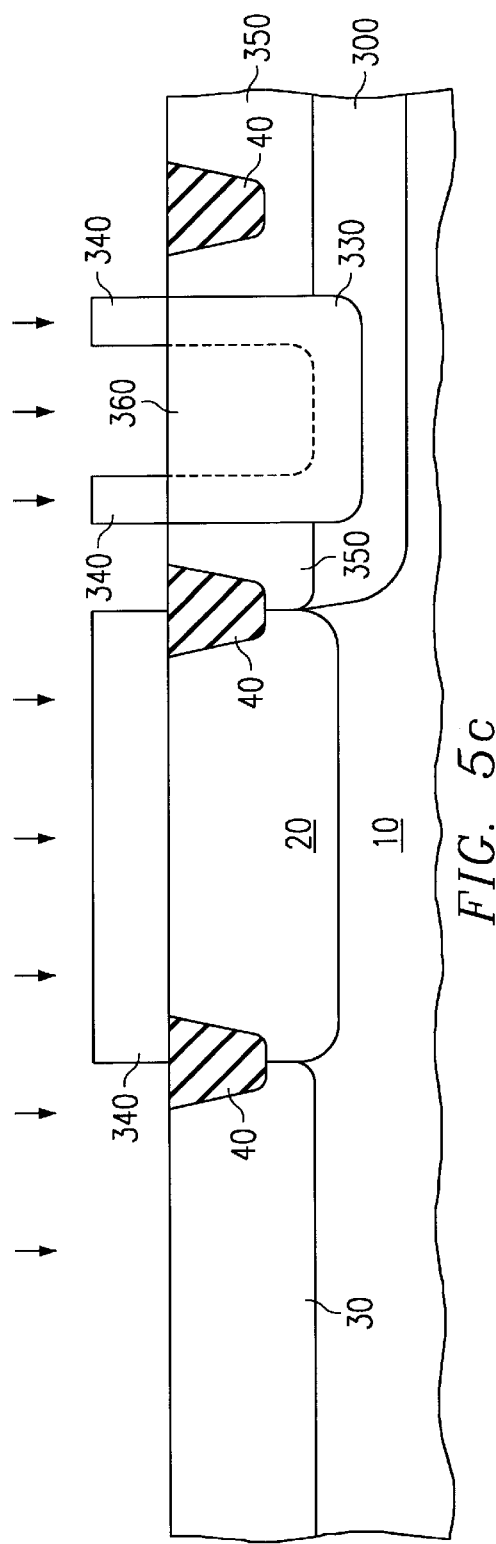
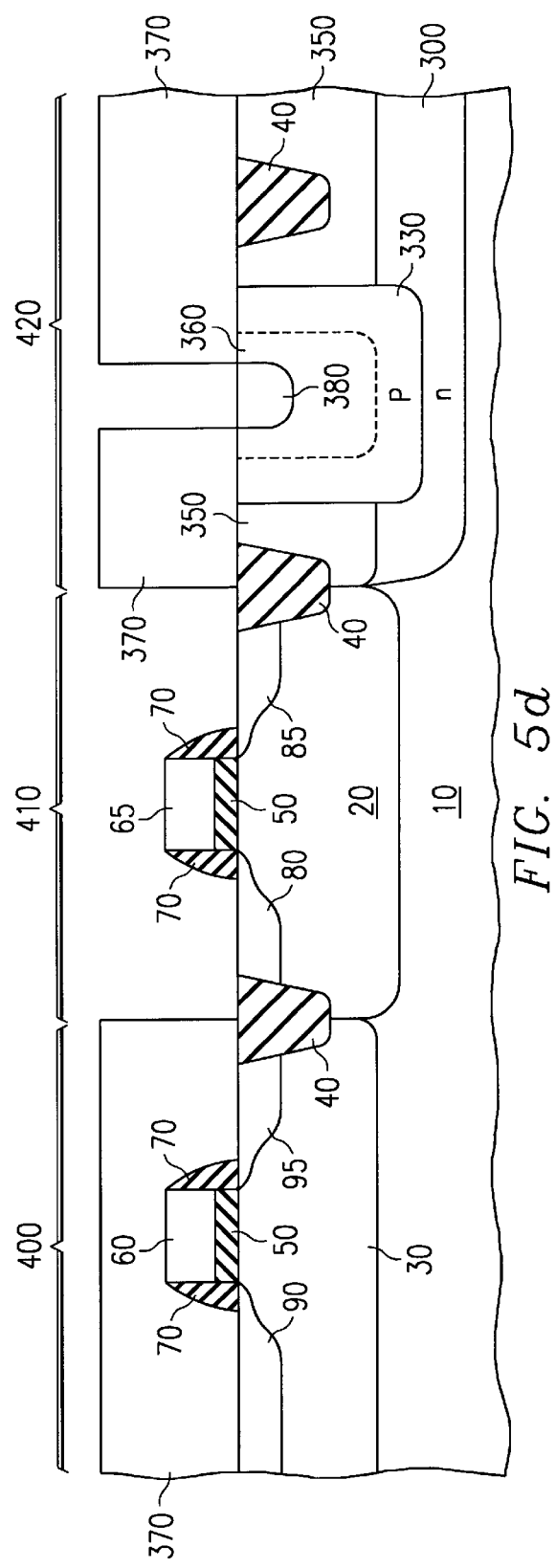
FIG. 5c
FIG. 5d

US 6,548,337 B2

METHOD OF MANUFACTURING A HIGH GAIN BIPOLAR JUNCTION TRANSISTOR WITH COUNTERDOPED BASE IN CMOS TECHNOLOGY

This application claims priority under 35 USC §119(e)(1) of provisional application Serial No. 60/244,543, filed Oct. 31, 2000.

FIELD OF THE INVENTION

The present invention relates to a method of forming a high gain bipolar junction transistor with a counterdoped base region using existing CMOS technology.

BACKGROUND OF THE INVENTION

In mixed signal applications it is sometimes necessary to have CMOS transistors and bipolar junction transistors (BJT) on the same chip or integrated circuit. Currently, integrating these devices on the same chip requires additional processes and a compromise in the performance of one or both types of devices. This compromise is necessary because the doping concentrations of the various well regions that are necessary to optimize the performance of the CMOS transistors will adversely affect the performance of the bipolar junction transistors (BJTs) present on the chip. Illustrated in FIG. 1 is a cross-section of a portion of an integrated circuit showing a PMOS transistor 12 and a NMOS transistor 14. The PMOS transistor 12 is formed in a n-well region 30 and the NMOS transistor 14 is formed in a p-well region 20. Both n-well 30 and p-well 20 regions are formed in a semiconductor substrate 10 using doping techniques such as ion implantation and diffusion. In most cases the semiconductor substrate 10 will be doped p-type but n-type doped substrates can also be used. Isolation is provided in the substrate using localized oxidation (LOCOS) or shallow trench isolation (STI). Shown in FIG. 1 is an example of STI isolation structures 40 which are formed by first etching a trench in the substrate 10 and then filling the trench with an insulating material such as silicon oxide, silicon nitride or both. A gate dielectric material 50 is formed on the substrate which will form the gate dielectric for the NMOS transistor 14 and the PMOS transistor 12. A conducting gate material is formed and patterned to form the PMOS transistor gate 60 and the NMOS transistor gate 65. Prior to the formation of the transistor sidewall structures 70, drain and source extension regions can be formed if required. The transistor sidewall structures are typically formed by first performing a conformal blanket deposition of a insulating dielectric followed by an anisotropic etch to form the sidewalls 70. Silicon nitride or silicon oxide is the insulating dielectric films typically used for sidewall formation. The PMOS transistor source region 90 and drain region 95 are formed by implanting p-type dopant species such as boron or $BF_2$ into the substrate adjacent to the sidewall structures 70. Thus for the PMOS transistor the source and drain regions 90 and 95 are p-type. The NMOS transistor source region 80 and drain region 85 are formed by implanting n-type dopant species such as arsenic and phosphorous into the substrate adjacent to the gate structure. Thus for the NMOS transistor the source and drain regions 80 and 85 are n-type.

In addition to the NMOS and PMOS transistors described above, CMOS integrated circuits also contain parasitic BJT devices. As shown in FIG. 1, a parasitic PNP BJT transistor is formed by the p-type drain region 95 of the PMOS transistor 12, the n-well region 30 and the p-well region 20. Similarly a parasitic NPN BJT is formed by the source region 80 of the NMOS transistor 14, the p-well region 20 and the n-well region 30. Thus the base of the parasitic NPN transistor is connected to the collector of the parasitic PNP transistor and vice versa. During normal operation of the CMOS circuit when various voltages are applied to the gate, source, drain, and well regions of the PMOS and NMOS transistors, proper operation of the CMOS circuit requires that the gain of the parasitic NPN and PNP transistors be less than one. If the gain of these parasitic transistors is greater than one latch-up of the CMOS circuit will occur and the CMOS circuit will cease to function. Therefore optimized CMOS circuits do not contain high gain parasitic BJTs. As stated above, certain circuit applications require both CMOS transistors and high gain BJTs on the same chip. There is therefore a need to form integrated high gain BJTs in optimized CMOS circuits without adding costly processing steps and process complexity.

SUMMARY OF INVENTION

The invention relates to a method of forming a high gain bipolar junction transistor with a counterdoped base region using existing CMOS technology. The bipolar junction transistor comprises a compensated base region which is formed by forming the p-well region and the n-well region in a common substrate region. In particular the method comprises: providing a semiconductor substrate; forming a p-well region in said semiconductor substrate by performing p-well ion implantation comprising p-type dopant species; forming a n-well region in said semiconductor substrate by performing n-well ion implantation comprising n-type dopant species; and forming a compensated base region of said bipolar junction transistor by allowing said p-well ion implantation and said n-well ion implantation to enter a common region of said semiconductor substrate.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which:

FIGS. 5(*a*)–5(*d*) are cross-section diagrams showing an embodiment of the instant invention.

DETAILED DESCRIPTION OF THE INVENTION

Figure 1:
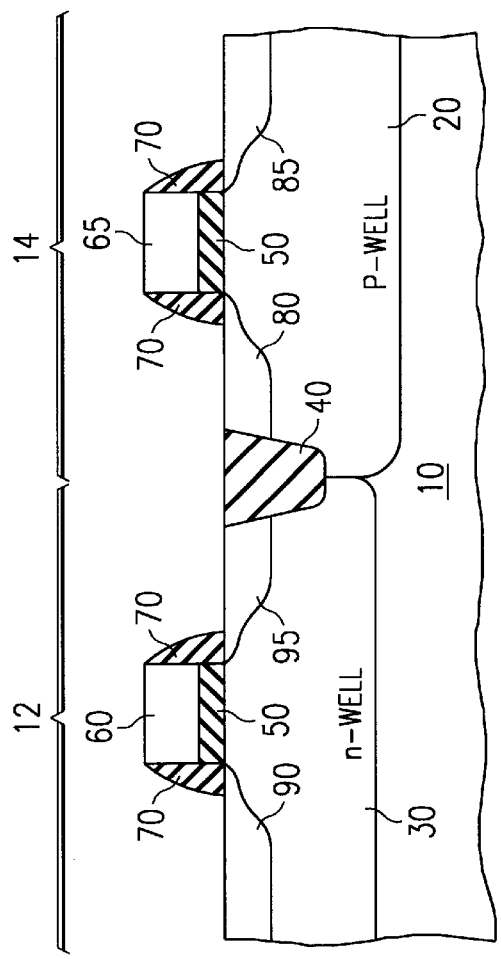
FIG. 1 is cross-section diagram of a portion of an integrated circuit showing a NMOS transistor and a PMOS transistor.

Illustrated in FIGS. 2(*a*)–2(*d*) are cross-section diagrams showing a method of forming a high gain vertical bipolar junction transistor (BJT) according to an embodiment of the instant invention. As shown in FIG. 2(*a*), STI isolation structures 40 are formed in a p-type semiconductor substrate 10. These STI structures are formed by first etching a trench in the substrate 10 and then filling the trench with an insulating dielectric material. In an embodiment of the instant invention this insulating dielectric material is comprised mainly of silicon oxide. Although STI isolation structures 40 are shown in FIG. 2(a), LOCOS isolation could be used without changing the scope of the instant invention. Following the formation of the isolation structures 40, a masking film is formed 100. This masking film 100 is preferably comprised of photoresist but other masking films could be used. Following the formation of the masking film 100, ion implantation of n-type dopant species is performed to form the n-well regions 30. In an embodiment of the instant invention forming the n-well regions 30 comprise a four step implant process. This four step process will result in a retrograde doping profile and comprises a well implant of phosphorous with a dose of $1 \times 10^{13}$–$6 \times 10^{13}$ cm$^{-2}$ at energies of 500 KeV–900 KeV, a channel stop implant of phosphorous with a dose of $1 \times 10^{12}$–$8 \times 10^{12}$ cm$^{-2}$ at energies of 100 KeV–550 KeV, a punch through implant of phosphorous with a dose of $1 \times 10^{12}$–$8 \times 10^{12}$ cm$^{-2}$ at energies of 50 KeV–300 KeV, and a threshold voltage implant of phosphorous with a dose of $1 \times 10^{12}$–$6 \times 10^{12}$ cm$^{-2}$ at energies of 5 KeV–100 KeV. In addition to the above described four step process, the n-well region can be formed using any number of implantation steps of n-type dopant species or n-type and p-type dopant species.

Figure 2A:
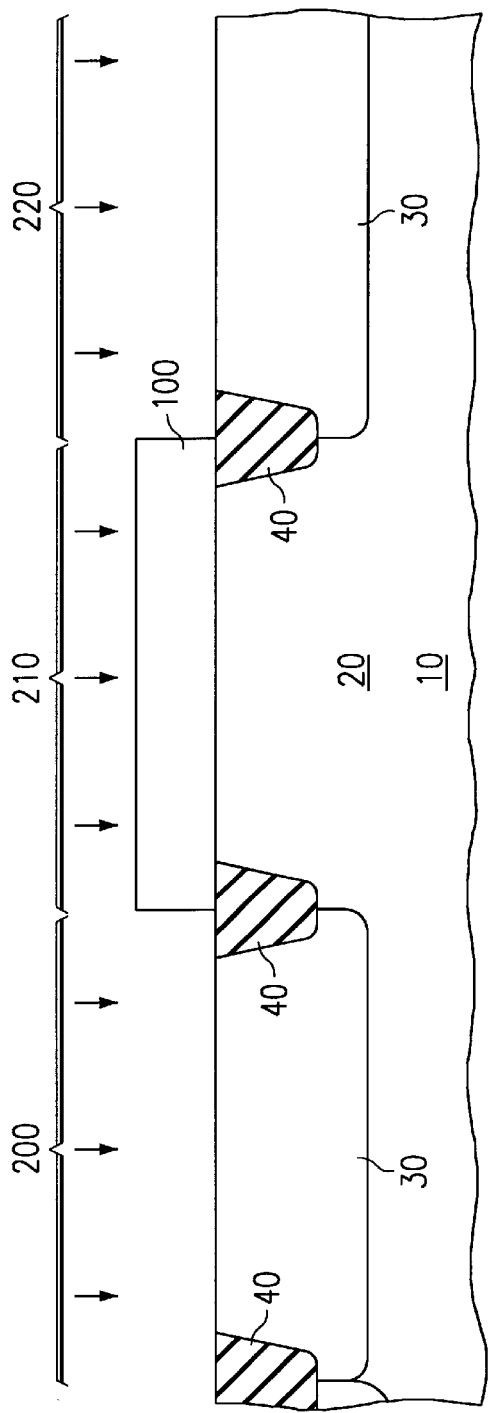
FIGS. 2(*a*)–2(*d*) are cross-section diagrams showing an embodiment of the instant invention.
Figure 2B:
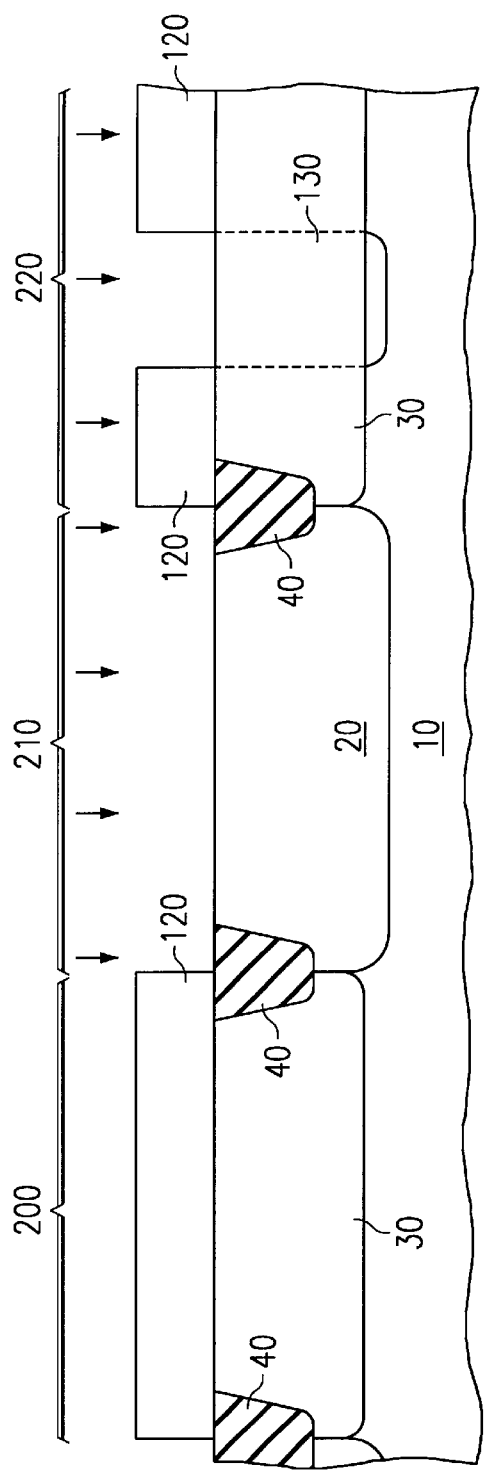

Shown in FIG. 2(b) is the formation of the p-well region 20 and the compensated base region 130 of the vertical BJT. Following the formation of the n-well regions 30, a masking film 120 is formed on the structure as shown in FIG. 2(b). This masking film 120 will mask the n-well region 30 from the subsequent p-well implants in the region where the PMOS transistor will be formed 200, and expose the base region of the BJT to the p-well implants in the region 220 where BJT will be formed. The NMOS transistor will be formed in region 210 which comprises the p-well 20. The p-well region 20 is formed by implanting p-type dopant species into the exposed regions of the substrate 10. In an embodiment of the instant invention forming the p-well regions 20 comprise a four step implant process. This four step process will result in a retrograde doping profile and comprises a well implant of boron with a dose of $1 \times 10^{13}$–$6 \times 10^{13}$ cm$^{-2}$ at energies of 250 KeV–600 KeV, a channel stop implant of boron with a dose of $1 \times 10^{12}$–$6 \times 10^{12}$ cm$^{-2}$ at energies of 75 KeV–270 KeV, a punch through implant of boron with a dose of $1 \times 10^{12}$–$1 \times 10^{13}$ cm$^{-2}$ at energies of 25 KeV–130 KeV, and a threshold voltage implant of boron with a dose of $1 \times 10^{12}$–$6 \times 10^{12}$ cm$^{-2}$ at energies of 5 KeV–100 KeV. In addition to the above described four step process, the p-well region can be formed using any number of implantation steps of p-type dopant species or p-type and n-type dopant species. It should also be observed in FIG. 2(b) that the depth of the p-well 20 is greater than the depth of the n-well 30. In forming the compensated base region 130 of the vertical BJT it is important that the doping profiles of the n-well 30 and p-well 20 region be offset to provide the proper BJT compensated base doping profile. Offset well doping profiles are usually present in CMOS technologies.

Figure 2C:
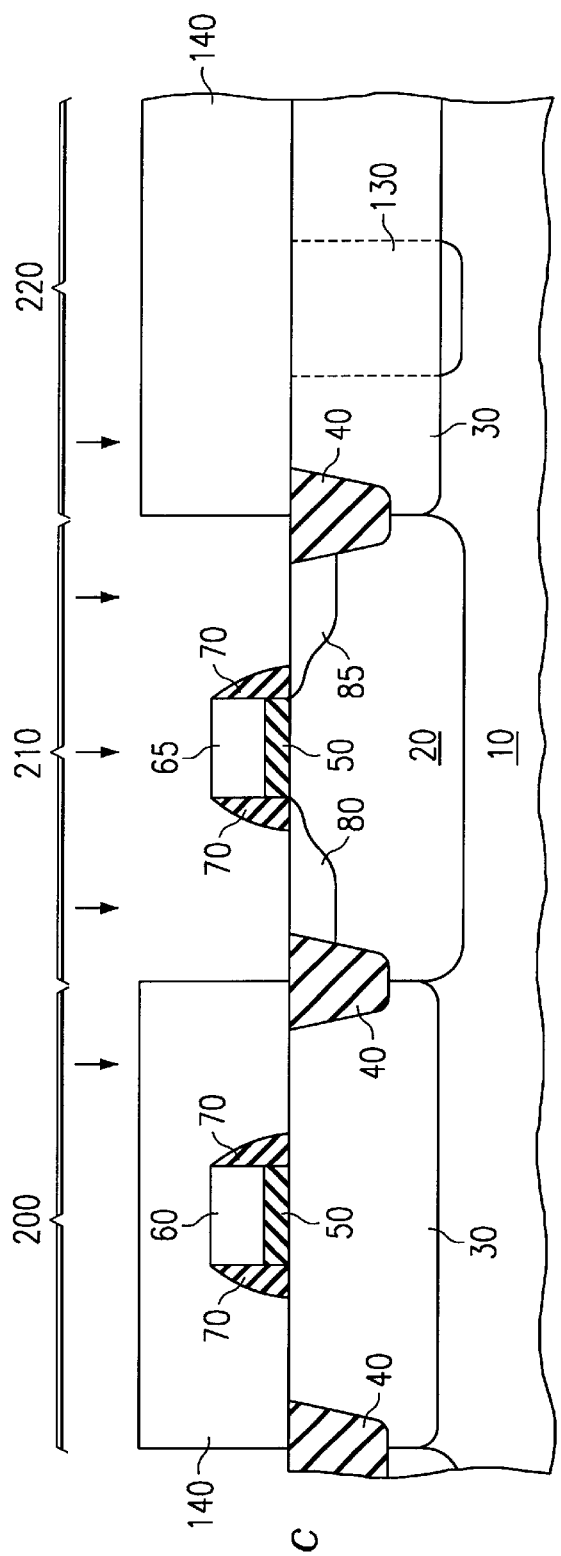

Following the formation of the p-well 20, the n-well 30, and the compensated base region 130, the MOS transistor gate dielectric layer 50 is formed as shown in FIG. 2(c). This gate dielectric layer 50 can comprise silicon oxide, silicon oxynitride, silicon nitride, or a silicate. A layer of conductive material is then formed and patterned to form the PMOS transistor gate 60 and the NMOS transistor gate 65. Following the formation of the PMOS and NMOS transistor gates 60 and 65, drain and source extension regions can be formed if required. The drain and source extension regions for the PMOS transistor 200 are formed by implanting p-type dopant species into the n-well region 30 that is adjacent to the PMOS transistor gate 60. Similarly, the drain and source extension regions for the NMOS transistor 210 are formed by implanting n-type dopant species into the p-well region 20 that is adjacent to the NMOS transistor gate 65. Following the formation of the drain and source extension regions (if necessary), sidewall structures 70 are formed adjacent to the transistor gates 60 and 65 as shown in FIG. 2(c). Following the formation of the sidewalls 70, the source and drain regions of the NMOS and PMOS transistors will be formed. In forming the NMOS transistor source region 80 and drain region 85, n-type dopants are implanted into the p-well region 20 which is adjacent to the sidewall structures of the NMOS transistor 210. During the NMOS transistor source and drain implantation formation process, the n-type dopant species are prevented from entering the PMOS transistor 200 and the vertical BJT 220 by a masking film 140 which was formed and patterned prior to the implantation process. This masking film can comprise photoresist but any suitable masking film can be used. In an embodiment of the instant invention the NMOS transistor 210 source and drain implantation process comprises a phosphorous implant at a dose of $8 \times 10^{13}$ cm$^{-2}$–$6 \times 10^{14}$ cm$^{-2}$ at energies of 20–90 KeV and an arsenic implant at a dose of $9 \times 10^{14}$ cm$^{-2}$–$5 \times 10^{15}$ cm$^{-2}$ at energies of 30–150 KeV. The NMOS transistor 210 source region 80 and drain region 85 are illustrated in FIG. 2(c).

Figure 2D:
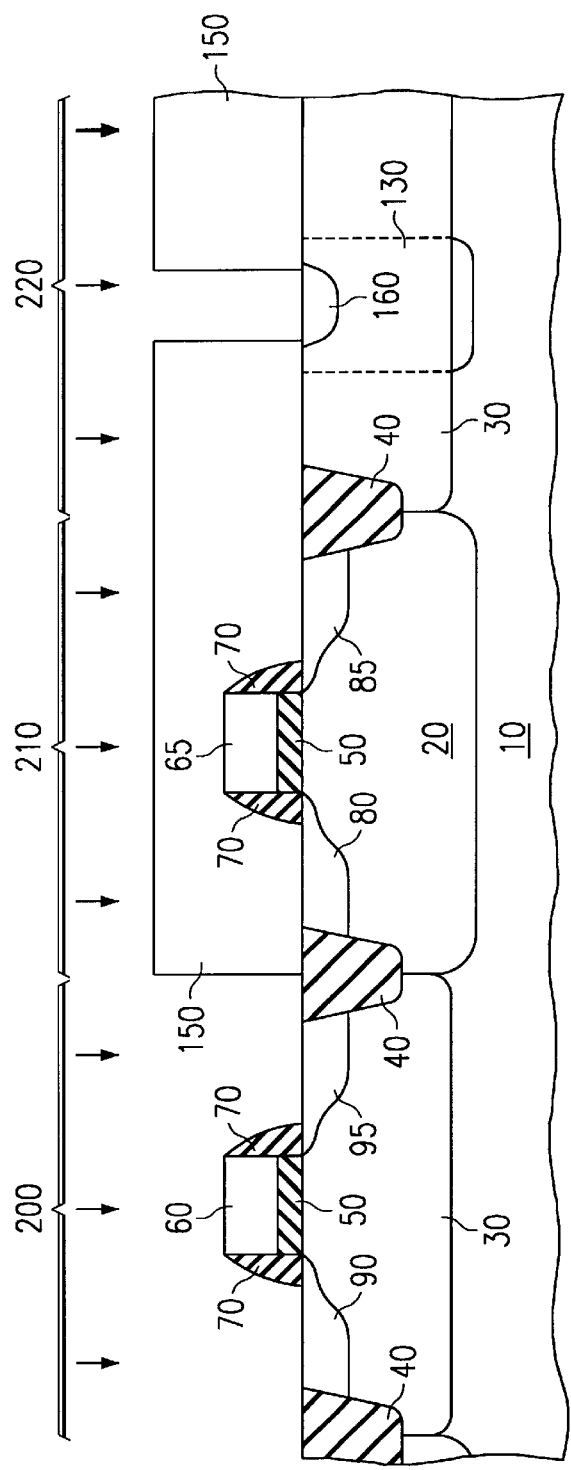

Following the formation of the NMOS transistor source and drain regions 80 and 85, a masking film 150 is formed as illustrated in FIG. 2(d). This masking film serves two purposes. It first serves to mask the NMOS transistor 210 during the PMOS transistor source and drain region formation process. It also serves to expose a region of the compensated base region 130 to this implant to form the emitter region of the vertical BJT. In an embodiment of the instant invention, the PMOS transistor source region 90 and drain region 95 are formed by implanting boron with a dose of $9 \times 10^{14}$ cm$^{-2}$–$6 \times 10^{15}$ cm$^{-2}$ at energies of 3–30 KeV into the n-well region 30 adjacent to the sidewall structures 70. The emitter region 160 of the vertical BJT is also formed during the PMOS transistor source and drain formation process. The completed high gain vertical BJT consists of a collector region formed by the p-type substrate and the CMOS p-well implant, a n-type compensated base region 130 formed by the CMOS p-well and the CMOS n-well implants, and a p-type emitter region 160 formed by the PMOS transistor source and drain implants. The integrated circuit can be completed using standard semiconductor processing techniques.

Figure 3A:
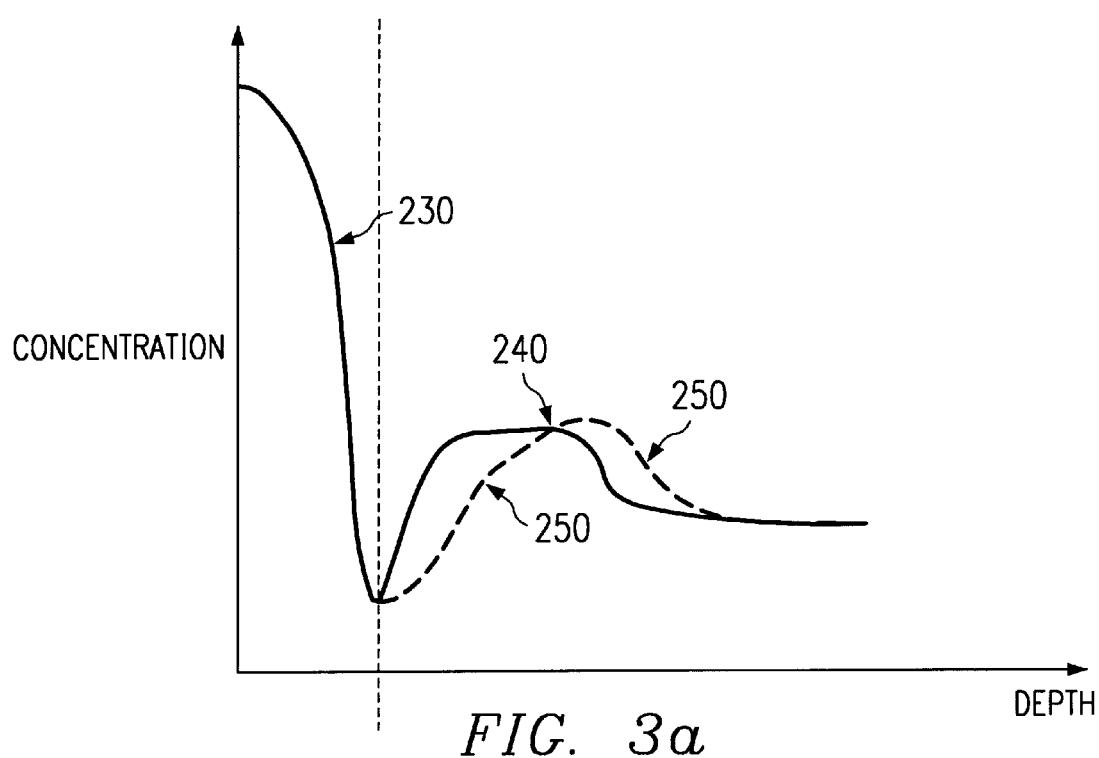
FIGS. 3(*a*)–3(*b*) are plots shown the various doping profiles of an embodiment of the instant invention.
Figure 3B:
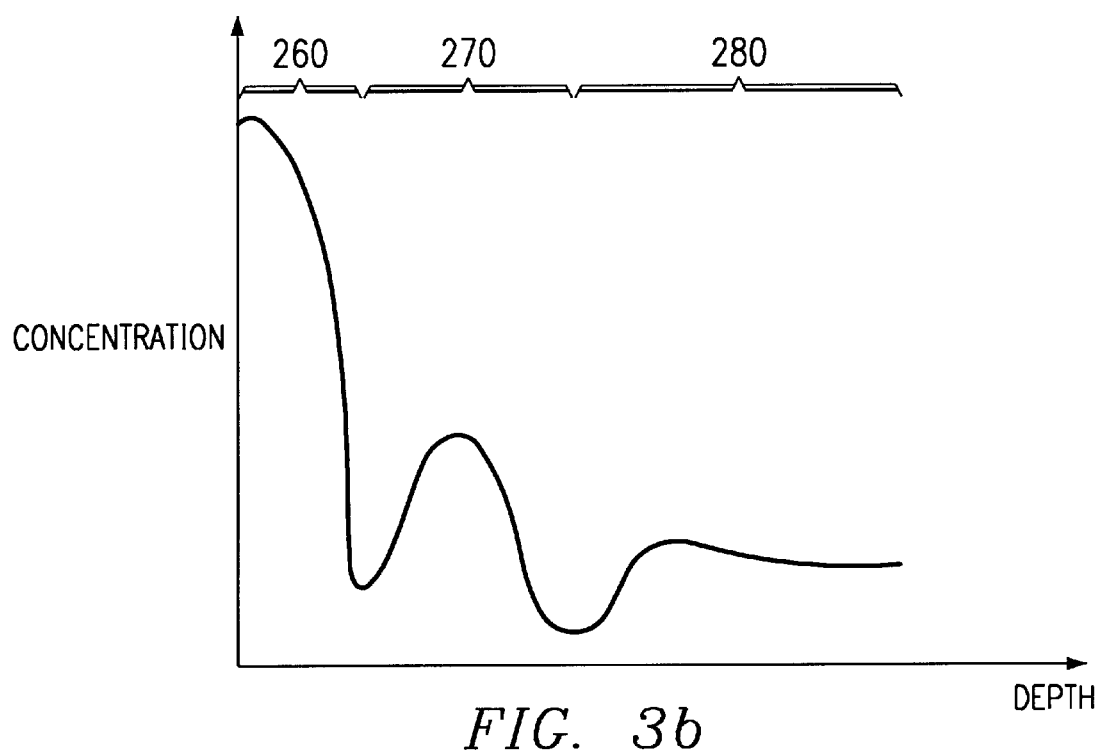

Shown in FIGS. 3(a) and 3(b) are the resulting doping profiles for the p-well, n-well, and the source and drain implants and the resulting high gain vertical BJT. FIG. 3(a) is a plot of doping concentration versus depth into the substrate for the source and drain implant 230, the n-well 240, and the p-well 250. The doping concentration profile for the resulting transistor is shown in FIG. 3(b). The emitter region 260 of the BJT is formed by the PMOS transistor source and drain implantation process, the compensated base region 270 of the BJT is formed by the CMOS n-well and p-well implantation processes. The collector region 280 is formed by the n-well implantation process, the p-well implantation process, and the p-type substrate. By implanting the base region of the BJT with both the n-well and the p-well implant processes the near ideal BJT doping profile shown in FIG. 3(b) is obtained.

Figure 4:
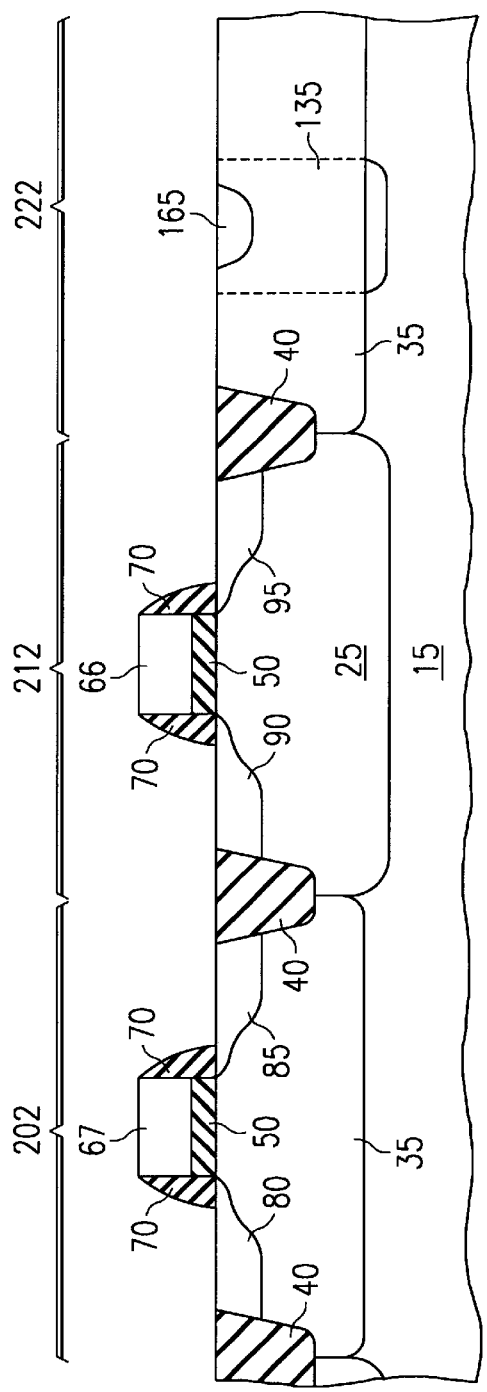
FIG. 4 is a cross-section diagram showing a further embodiment of the instant invention.

The above described embodiment of the instant invention describes the formation of a vertical high gain PNP BJT. An NPN vertical high gain BJT can be formed using the method of the instant invention by simply changing the doping types. An example of a NPN vertical high gain BJT is shown in FIG. 4. Here the semiconductor substrate is n-type and the depth of the n-well region 25 is greater than the depth of the p-well 35. The PMOS transistor 212 and NMOS transistor 202 are formed using the same processing techniques described above with changes in some of the implantation conditions. The PMOS transistor gate 66 and the NMOS transistor gate 67 both comprise a conductive film as described above. The NPN vertical high gain BJT 222 comprises an emitter region 165 which would be formed using the NMOS transistor source and drain implantation process. The compensated base region 135 is formed using the CMOS n-well and p-well implantation processes. The collector of the BJT will be formed mainly by the n-type substrate 15.

A further embodiment of the instant invention is shown in FIGS. 5(a)–5(d). In this embodiment a vertical high gain NPN transistor is formed using a deep n-well process. In some CMOS circuit applications, isolated NMOS transistors are required. One method of forming an isolated NMOS transistor is to use a deep n-well. In this method, the p-well region in which the NMOS transistor is formed is itself formed in a deep n-well region which serves to isolate the p-well region (and therefore the NMOS transistor) from the substrate. Shown in FIG. 5(a) is the formation of a deep n-well. A masking layer 310 is formed to mask the areas of the p-type substrate 10 where no deep n-well is desired. In an embodiment of the instant invention, the deep n-well 300 is formed by implanting phosphorous at a dose of $1\times10^{12}$ cm$^{-2}$–$9\times10^{12}$ cm$^{-2}$ at energies of 2000–4000 KeV. In general, the deep n-well can be formed by implanting any n-type dopant species into the substrate 10.

Following the formation of the deep n-well 300, a masking layer 320 is formed as shown in FIG. 5(b). This masking layer can comprise photoresist but any suitable material can be used. The masking layer 320 will mask certain regions of the substrate 10 during the CMOS p-well formation process. The CMOS p-well region 20 is formed by the implantation of p-type dopants as described above. Compensated region 330 is formed simultaneously with the CMOS p-well region 20 by allowing the p-well implant to enter a region of the deep n-well 300 defined by the masking layer 320.

Following the formation of the p-well region 20 and the compensated region 330, a masking layer 340 is formed as shown in FIG. 5(c). Following the formation of the masking layer 340, the CMOS n-well implant is performed as described above. This implant forms the CMOS n-well region 30, the region 350, and the compensated region 360.

Illustrated in FIG. 5(d) is the completed NPN vertical high gain BJT 420. Following the CMOS n-well implantation processes, the transistor gate dielectric layers 50, PMOS and NMOS gates 60 and 65, the sidewall structures 70, and the PMOS source and drain regions 90 and 95 are formed as described above. Before the formation of the NMOS source and drain regions, a masking layer 370 is formed as shown in FIG. 5(d). During the formation of the NMOS transistor source and drain regions 80 and 85, the emitter region 380 of the BJT 420 is also formed. The NMOS transistor source and drain regions 80 and 85 are formed by implanting n-type dopants into the p-well region 20 adjacent to the sidewall structures 70 of the NMOS transistor 410 as described above. These n-type dopants will simultaneously form the n-type emitter region 380 of the BJT 420. The completed NPN high gain BJT comprises a n-type emitter region 380, a collector region comprising a portion of the deep n-well region 300 and the n-type region 350, and a base region comprising the uncompensated portion of region 330. A PNP high gain BJT can be formed using a deep p-well structure according to the instant invention by simply changing the doping of the various regions shown in FIG. 5(d) from n-type to p-type and vice versa.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming a bipolar junction transistor on an integrated circuit comprising:
    providing a semiconductor substrate:
        forming a p-well region in said semiconductor substrate by performing p-well ion implantation comprising p-type dopant species;
        forming a n-well region in said semiconductor substrate by performing n-well ion implantation comprising n-type dopant species; and
        forming a compensated base region of said bipolar junction transistor by allowing said p-well ion implantation and said n-well ion implantation to enter a common region of said semiconductor substrate.

2. The method of claim 1 wherein at least one NMOS transistor is formed in said p-well region.

3. The method of claim 1 wherein at least one PMOS transistor is formed in said n-well region.

4. The method of claim 1 wherein said n-well region and said p-well region have offset doping concentration profiles.

5. The method of claim 4 wherein for a PNP bipolar junction transistor, the depth of the p-well region is greater than the depth of the n-well region.

6. The method of claim 4 wherein for a NPN bipolar junction transistor, the depth of the n-well region is greater than the depth of the p-well region.

7. The method of claim 1 further comprising forming an emitter region of the bipolar junction transistor by simultaneously implanting the compensated base region of said bipolar junction transistor with an ion implantation process used to form the source and drain region of the PMOS transistor or the NMOS transistor.

8. A method for forming a bipolar junction transistor on an integrated circuit comprising:
    providing a semiconductor substrate;
    forming a p-well region in said semiconductor substrate by performing p-well ion implantation comprising p-type dopant species;
    forming a n-well region in said semiconductor substrate by performing n-well ion implantation comprising n-type dopant species;
    forming a deep well region in said semiconductor substrate by performing deep well ion implantation comprising p-type dopant species, n-type dopant species, or both p-type and n-type dopant species; and
    forming a compensated base region of said bipolar junction transistor by allowing said p-well ion implantation and said n-well ion implantation to enter said deep well region of said semiconductor substrate.

9. The method of claim 8 wherein at least one NMOS transistor is formed in said p-well region.

10. The method of claim 8 wherein at least one PMOS transistor is formed in said n-well region.

11. The method of claim 8 wherein said n-well region and said p-well region have offset doping concentration profiles.

12. The method of claim 11 wherein for a PNP bipolar junction transistor, the depth of the p-well region is greater than the depth of the n-well region.

13. The method of claim 11 wherein for a NPN bipolar junction transistor, the depth of the n-well region is greater than the depth on the p-well region.

14. The method of claim 8 further comprising forming an emitter region of the bipolar junction transistor by simultaneously implanting the compensated base region of said bipolar junction transistor with an ion implantation process used to form the source and drain region of the PMOS transistor or the NMOS transistor.

* * * * *

UNITED STATES PATENT AND TRADEMARK OFFICE
CERTIFICATE OF CORRECTION

PATENT NO. : 6,548,337 B2
DATED : April 15, 2003
INVENTOR(S) : Chi-Cheong Shen et al.

It is certified that error appears in the above-identified patent and that said Letters Patent is hereby corrected as shown below:

<u>Title page,</u>
Item [73], name of Assignee is corrected to -- Texas Instruments Incorporated --

Signed and Sealed this

Twelfth Day of August, 2003

JAMES E. ROGAN
*Director of the United States Patent and Trademark Office*